United States Patent [19]
Koloc

[11] Patent Number: 4,891,180
[45] Date of Patent: Jan. 2, 1990

[54] METHOD AND APPARATUS FOR GENERATING AND UTILIZING A COMPOUND PLASMA CONFIGURATION

[76] Inventor: Paul M. Koloc, Box 222, College Park, Md. 20740

[21] Appl. No.: 632,690

[22] Filed: Jul. 23, 1984

Related U.S. Application Data

[60] Continuation of Ser. No. 261,546, May 7, 1981, abandoned, which is a continuation of Ser. No. 902,839, May 4, 1978, abandoned, which is a continuation of Ser. No. 706,454, Jul. 19, 1976, abandoned, which is a division of Ser. No. 409,060, Oct. 24, 1973, Pat. No. 4,023,065.

[51] Int. Cl.$^4$ .............................................. G21B 1/00
[52] U.S. Cl. .................................... 376/144; 376/100; 376/128; 376/146
[58] Field of Search .................. 376/100, 127–130, 376/144–146

[56] References Cited

U.S. PATENT DOCUMENTS

| | | | |
|---|---|---|---|
| 2,946,914 | 7/1960 | Colgate et al. | 313/231.3 |
| 3,107,211 | 10/1963 | Mallinckrodt | 176/1 |
| 3,120,481 | 2/1964 | Post | 176/8 |
| 3,303,097 | 2/1967 | Mallinckrodt | 176/1 |
| 3,579,028 | 5/1971 | Paine | 176/6 |
| 3,677,889 | 7/1972 | Coensgen et al. | 376/128 |
| 4,023,065 | 5/1977 | Koloc | 176/3 |
| 4,182,650 | 1/1980 | Fischer | |

FOREIGN PATENT DOCUMENTS

| | | | |
|---|---|---|---|
| 1022711 | 1/1958 | Fed. Rep. of Germany | 176/1 |
| 892344 | 3/1962 | United Kingdom | 376/128 |
| 953524 | 3/1964 | United Kingdom | 376/128 |

OTHER PUBLICATIONS

Matt-1050, 8/74, pp. 526–529.
Technology Review, 12/76, pp. 20–24, 28–30, 33–36, 39, 41–43.
"The Universe", Time-Life Books, by Bergamini, 1962, 1971, pp. 101–103.
Soviet Atomic Energy, vol. 25, No. 2, 8/68, Arsenin et al, 902–903.

*Primary Examiner*—Harvey E. Behrend
*Attorney, Agent, or Firm*—Oblon, Spivak, McClelland, Maier & Neustadt

[57] ABSTRACT

A method and apparatus for generating and utilizing a compound plasma configuration is disclosed. The plasma configuration includes a central toroidal current surrounded by a generally ellipsoidal mantel of ionized particles. The preferred methods of forming this compound plasma configuration include the steps of forming a helical ionized path in a gaseous medium and simultaneously discharging a high potential through the ionized path to produce a helical current which collapses on itself to produce a toroidal current, or generating a toroidal plasmoid, supplying magnetic energy to the plasmoid, and applying gas pressure external to the plasmoid. The apparatus of the present invention includes a pressure chamber wherein the compound plasma configuration can be isolated or compressed by fluid or other forms of mechanical pressure.

8 Claims, 5 Drawing Sheets

METHOD AND APPARATUS FOR GENERATING AND UTILIZING A COMPOUND PLASMA CONFIGURATION

This application is a continuation of application Ser. No. 216,546, filed May 7, 1981, now abandoned, which is a continuation of application Ser. No. 902,839 filed May 4, 1978, now abandoned, which is a continuation of Ser. No. 706,454 filed July 19, 1976, now abandoned, which is a divisional of application Ser. No. 409,060 filed Oct. 24, 1973 and now U.S. Pat. No. 4,023,065.

FIELD OF THE INVENTION

This invention relates generally to a method and apparatus for forming, manipulating and utilizing matter in the plasma state, and more particularly to a method and apparatus for forming, manipulating and utilizing a compound plasma configuration including a toroidal central current surrounded by a generally ellipsoidal mantle of ionized particles.

DESCRIPTION OF THE PRIOR ART

Since the present invention is in the field of high energy plasma physics and is intended to provide a step forward in the search for techniques to maintain controlled thermonuclear reactions, it is believed that a brief discussion of recent developments in the thermonuclear reactor field would be appropriate.

In essence, to achieve nuclear fusion it is necessary to heat a small quantity of fusion fuel above its ignition point, isolate the heated fuel charge from its surroundings long enough so that the release of fusion energy exceeds the input of heat energy, and finally convert the energy released into a useful form. The well known problem that is encountered in attempting to achieve nuclear fusion resides in the fact that relative kinetic energies of 10 KeV or more are required to cause fuel particles to fuse. This energy translates to a 100 million degree kinetic temperature, creating a need for magnetic confinement of the fusion plasma.

The problem that has prevented satisfactory containment of plasmas by magnetic fields is the inherent instability of the plasma confined in most field configurations and the end looses created by field discontinuities. As a result of the instability and end loss problems, devices existing in the past have been unable to attain a sufficiently high $N\tau$ product to attain fusion. According to the Lawson criteria, the $N\tau$ product must be greater than $10^{14}$ sec per $cm^3$, implying confinement times of between approximately 0.1 and 1.0 seconds for steady-state reactors. Even the most advanced prior art devices, such as the Tokomak, have been unable to attain confinement times of the proper order of magnitude required by the Lawson criterion. Laser or "micro explosion" devices have similarly failed to achieve time density products anywhere near that required by the Lawson criterion. More extensive analyses of prior art devices may be found in the following articles:

Bishop, Amasa, "Project Sherwood: U.S. Program in Controlled Fusion", Addison Wesley Publishing Company, Reading, Mass., U.S.A., 1958;

Post, Richard F. "Prospects for Fusion Power", *Physics Today*, Vol. 26, April, 1973, pp. 30–38;

Tuck, James L. "L' Energie de Fusion", *LA Recherche*, vol. 3, October, 1972, pp. 857–872.

Gough, William C. and Eastiund, Bernard J., "The Prospects of Fusion Power", *Scientific American*, Vol. 224, No. 2, PP 50–64, 1971.

In view of the failure of previously existing systems and techniques to achieve satisfactory confinement of fuel plasmas, and in view of the fact that previous devices have generally consisted of minor variations on a few basic techniques of plasma confinement, it is believed that a need exists for a novel approach to the problems posed by nuclear fusion, and in particular it is believed that a need exists for utilization of a novel plasma configuration.

SUMMARY OF THE INVENTION

Accordingly, one object of this invention is the provision of novel methods for producing a unique compound plasma configuration.

Another object of this invention is the provision of novel apparatuses for producing a unique compound plasma configuration.

Yet another object of this invention is the provision of novel methods for manipulating and utilizing a unique compound plasma configuration.

Another object of this invention is the provision of novel apparatuses for manipulating and utilizing a unique compound plasma configuration.

Briefly, these and other objects of the invention are achieved by discharging a high energy voltage through a fuel atmosphere ionized in a helical path to form a helical current path. This helical current subsequently develops into a torridal current forming the kernel of a compound plasma configuration. The high temperature energy of the plasma kernel ionizes the surrounding atmosphere to develop a mantle of charged particles surrounding the plasma kernel which is susceptable to compression by mechanical forces. The apparatus for carrying out these steps also includes a system for applying fluid pressure to the resulting compound plasma configuration for the purpose of compressing the plasma mechanically. Alternative method and apparatuses are also disclosed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is an illustration of a compound plasma configuration of a plasma mantle-kernel configuration (PMK)

illustrating the internal poloidal magnetic field of the PMK:

DESCRIPTION OF THE PREFERRED EMBODIMENTS

Figure 1:
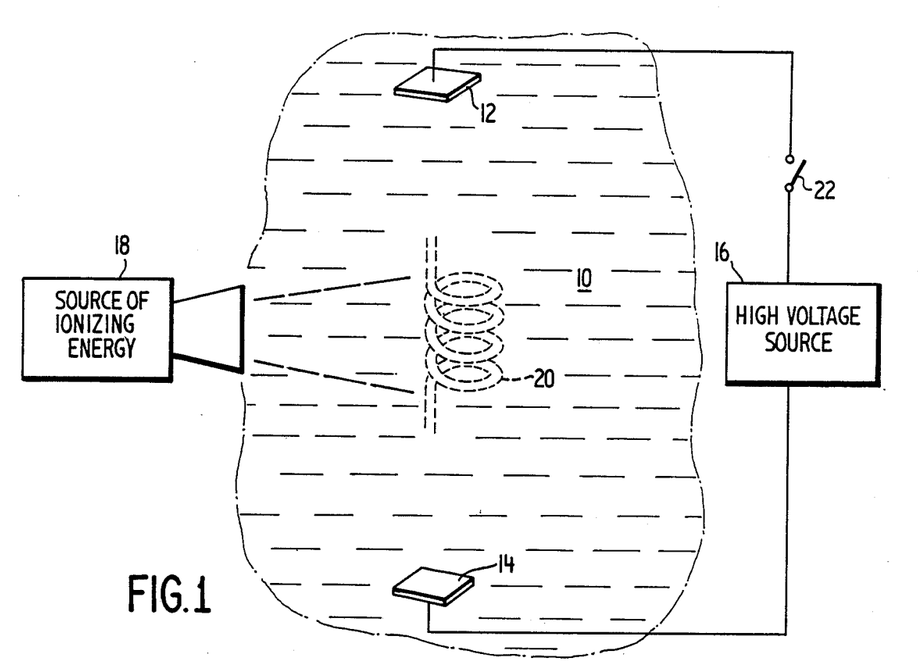
FIG. 1 is a schematic diagram of a first step in the method of the present invention showing the general ionization of an atmosphere and especially in a helical path.
Figure 2:
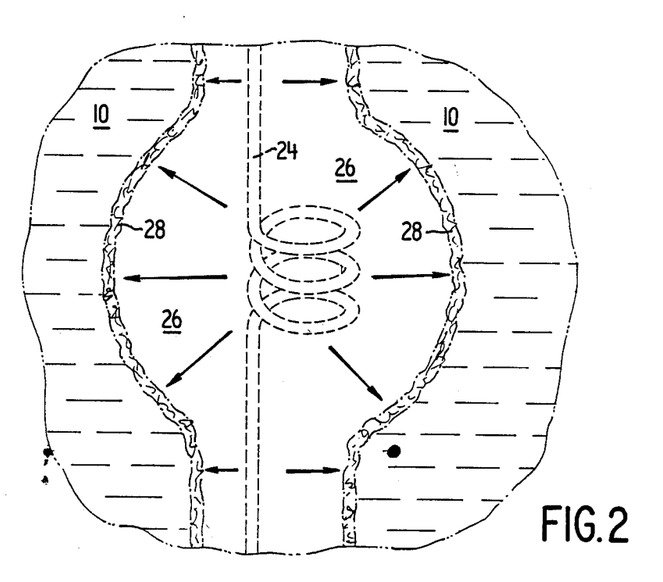
FIG. 2 is an illustration of a second step in the method of the present invention showing the current discharge and associated magnetic forces along the ionized path of FIG. 1.

Referring now to the drawings, wherein like reference numerals designate identical or corresponding parts throughout the several views, and more particularly to FIG. 1 thereof, a first step in the method of the present invention is schematically illustrated. An atmosphere of gaseous deuterium 10, or some equivalent material suitable for producing a high energy plasma, is created in a region between a pair of high voltage electrodes 12 and 14. The electrodes 12 and 14 are coupled to a suitable high voltage source 16. A source of ionizing energy 18 is oriented to project or focus ionizing energy into an area of the deuterium atmosphere 10 in the region between the electrodes 12 and 14. The projected ionizing energy is preferably formed or focused into a substantially helical path so that generally helical region of ionized particles 20 is formed between the electrodes 12 and 14. When the high voltage potential generated by the source 16 is applied across electrodes 12 and 14 by closure of a switch 22, the high voltage potential difference between the two electrodes will result in a discharge through the atmosphere 10 following the ionized path 20. The result will be the formation of a helical current stroke 24 as illustrated in FIG. 2. The extremely high rise time of the current stroke 24 resulting from the high magnitude of the potential difference between the electrodes 12 and 14 causes a sufficiently rapid build up of magnetic energy so as to explosively displace the ionized gas surrounding the channel. This force results in the creation of a low pressure or semi-evacuated region 26 surrounding the helical current stroke 24. Similarly, the high power and high temperature radiation of the current stroke 24 also result in the formation and maintainance of an ionized boundary layer or mantle 28 which forms an interface between the atmosphere 10 and the semi-evacuated region 26. In addition to the shock expansion of the ionized gas due to the high rise time current stroke 24 produces an intensification of ionization at the magnetic and ionized gas boundary or mantle 28.

Figure 3:
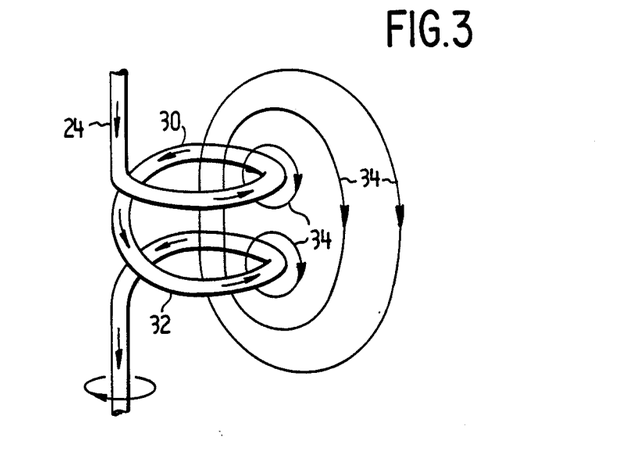
FIG. 3 is a schematic diagram illustrating the magnetic field coupling of adjacent turns produced by the discharge illustrated in FIG. 2.
Figure 4:
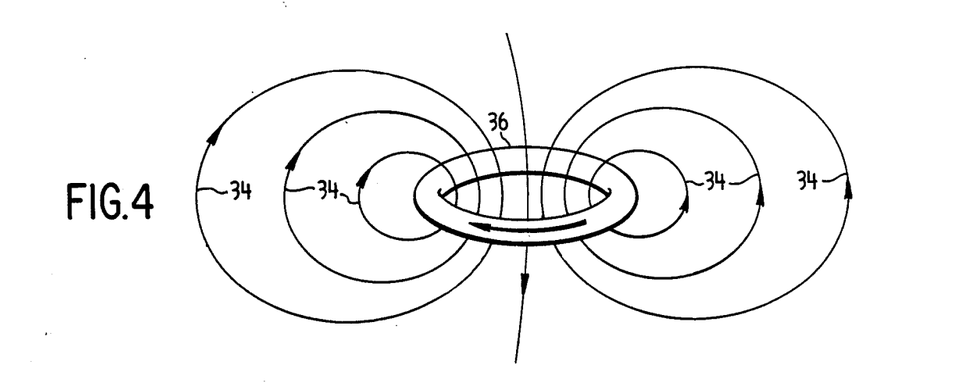
FIG. 4 is a schematic diagram illustrating a toroidal current and its associated unconstrained poloidal magnetic field.

The helical path followed by the current stroke 24 is important because of its magnetic properties. Although the discharge path may consist of a single loop, as shown in greater detail in FIG. 3, the current stroke 24 usually includes a plurality of loops, only two of which are illustrated at 30 and 32. Each of these current loops produces magnetic field represented in FIG. 3 by lines of flux 34. The magnetic fields produced by the various current loops couple together, drawing the current loops together into a single toridal current loop 36, illustrated in FIG. 4. The toridal current loop 36 becomes the plasma kernel of the compound plasma structure formed according to the present invention. The plasma kernel 36 produces a poloidal magnetic field around it, as illustrated by the flux lines 34.

Figure 5:
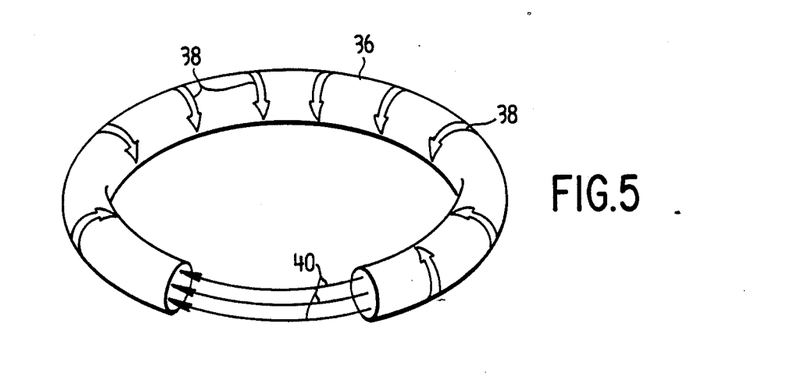
FIG. 5 is a schematic diagram of the internal toroidal magnetic field and poloidal surface currents produced in a plasma torus.

FIG. 5 illustrates in greater detail the dynamic energy configuration of the plasma kernel 36, showing in particular a circular surface current 38 which circulates about the minor axis of the toroidal kernel. The surface current 38 results in a toroidal magnetic field within the heart of the kernel 36, represented by the flux lines 40.

Figure 6:
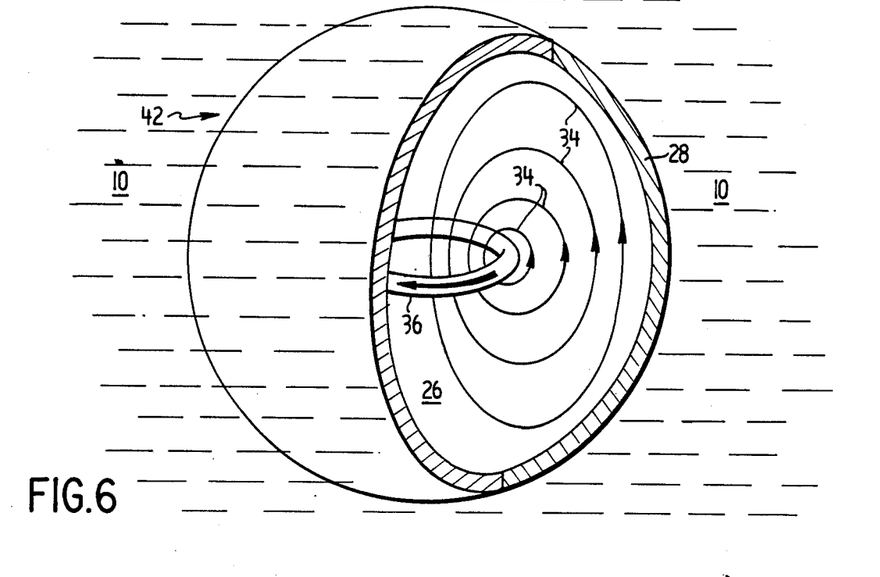

Referring again to FIG. 2, it will be recalled that an ionized layer or mantle 23 is formed around the current stroke 24, before it collapses into the toroidal kernel 36. As the toroidal kernel 36 is formed, the portions of the current stroke on either side of the helical or looped portion dissipate rapidly, as do the mantle portions associated with these non-looped portions of the current stroke, As a result, the mantle 28 tends to collapse into a generally ellipsoidal shape surrounding the kernel 36, substantially as shown in FIG. 6. The compound plasma configuration shown in FIG. 6 will be designated the plasma-mantle-kernel configuration, or PMK 42. This configuration is a substantially stable one in that the current of the kernel 36 exists in a partial vacuum and thus does not dissipate rapidly. The kernel current also produces a strong poloidal field, represented by the flux lines 34, supporting the ionized particles in the mantle 28, thereby preventing the mantle from collapsing into the low pressure, low density region within. The mantle 28 is prevented from expansion, however, because the pressure of the internal poloidal field reaches equilibrium with the fluid pressure of the external atmosphere 10.

Figure 7:
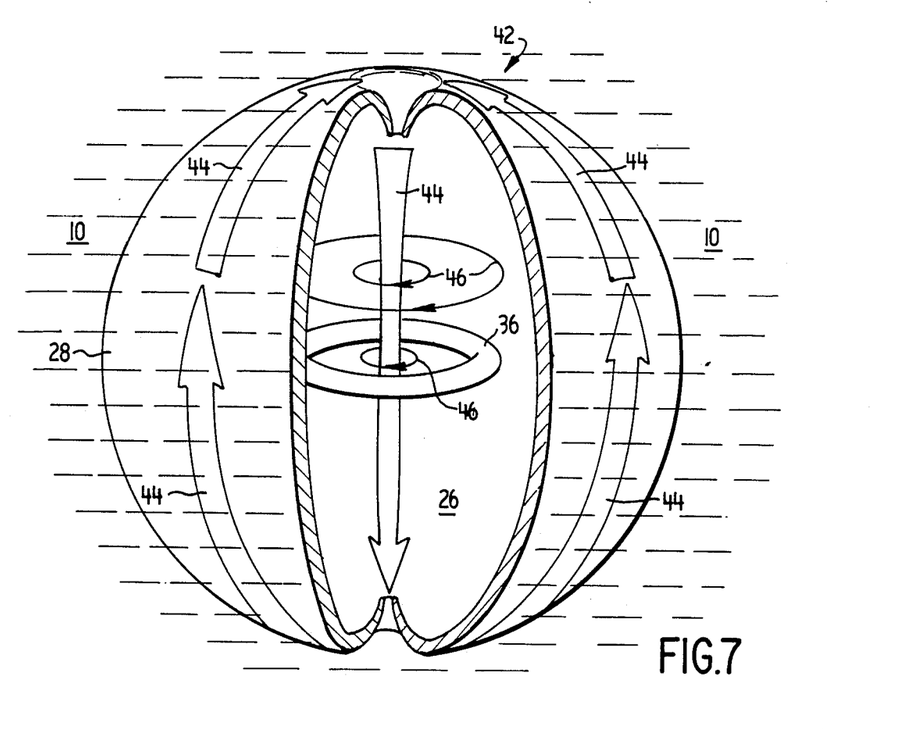
FIG. 7 is a partially cut-away schematic diagram of the PMK of FIG. 6 illustrating the poloidal currents in the mantel and the internal toroidal magnetic field produced by the toroidal current kernel.

FIG. 7 illustrates a poloidal current 44 which circulates around the mantel 28 and threads through the center of the toroidal kernel 36, following the flux lines of the poloidal field generated by the kernel 36. The poloidal current 44 results in the formation of a toroidal field within the low pressure region 26, as illustrated by flux lines 46. The sum of the toroidal and poloidal fields shown in FIGS. 6 and 7, respectively, is not shown. However, the intermixing of the poloidal fields is important and is related to the stability parameter known as the Kruskal-Shafranov limit.

The initial energy used to form the helical ionized path may take any one of many forms. For example, X-ray energy can be used, as can electron or ion beams. Furthermore, conventional corona discharge equipment can be used, as can laser energy. An extremely powerful flashlamp and an optical focusing system can also be used to produce the helical ionized path. Other techniques for forming the helical ionized path include a wire of $Li^6$ or $LiH_3^2$ which can be explosively energized by the application of an extremely high current or voltage. A gas vortex with a heliform rarefaction channel can also be used. Naturally, numerous additional techniques are within the realm of those skilled in the art for forming the ionized helical path.

In forming the kernel 36 of the PMK 42 as described above, it was explained that the initially helical current discharge collapses into a single toroidal loop configuration. This collapsing of the current results in the formation of the circular surface currents 38 which flow about the minor radius of the toroidal kernel 36, producing the toroidal field 40 and stabilizing the kernel configuration. The poloidal currents 44 flowing on the surface of the mantle 28 may in some cases be formed automatically by perturbations in the fields produced by the initial formation of the PMK. On the other hand, such currents can be induced by triggering second discharge between the electrodes 12 and 14, threading through the open center of the toroidal kernel 36. The poloidal currents 44, which generate the internal toroidal field 46, also tend to stabilize the PMK configuration. The viscosity and pressure of the external fluid surround the mantle of the PMK also provides a damping and volume constraining influence on any expansion or contraction of the kernel, thereby further tending to stabilize the PMK configuration.

The low pressure or nearly evacuated region 26 within the PMK prevents the kernel current from losing conductivity due to diffusion of current particles. As a result the kernel current may exist for a substantial period of time during which its primary energy loss is through high temperature radiation to the mantle 28. Naturally, the duration or life of the kernel current, and of the resulting PMK, varies greatly depending upon the total energy of the PMK, the pressure of the surrounding gaseous atmosphere, the impurities in the atmosphere and the quality of the vacuum in the low pressure region 26.

From the foregoing it should be apparent that the PMK plasma configuration does not depend on any external magnetic or electric field for its existence. Rather, it is similar to a charged battery in that it is able to store or retain energy for a relatively significant period of time, depending upon the temperature, surrounding fluid pressure, and its initial energy content. However, further energy can be supplied to the PMK by compressing it mechanically with fluid pressure. In this regard it is noted that the charged particles forming the ionized mantel 28 generally will not penetrate the intensive poloidal field generated by the circulating current forming the kernel 36. Thus physical fluid pressure can be exerted on the mantle 28 for compressing the mantle. However compression of the mantle will force compression of the poloidal field, indicated by flux lines 34, and will result in increasing the energy and temperature of the kernel. Accordingly the internal temperature and energy of the PMK can be increased by applying mechanical fluid pressure to the exterior surfaces of the mantle 28. In this regard it is noted that if a gas or liquid is used to apply fluid pressure to the mantle, particles will, of course, diffuse through and penetrate the mantle. However these particles will becomes ionized as they are exposed to the intense heat radiated by the kernel 38, and thus will, in effect, become portions of the mantle 28, and will thus be unable to penetrate the magnetic field within the PMK in large quantities. Thus the inherent internal energy of the PMK will prevent surrounding gas molecues from penetrating into the low pressure region 26, so that this region will maintain its near vacuum condition.

Energy can also be supplied to the PMK by external electrical, magnetic and electromagnetic fields as will be apparent to those skilled in the art. Furthermore, external magnetic and electric fields can be used to physically manipulate the PMK. Similarly, external fluid pressure and even mechanical devices can be used to move or manipulate the PMK, since it behaves in some extent in the same manner as a somewhat rigid physical body. Movement of the PMK by mechanical tools, such as a metal piston, for example, is possible because of the image currents induced in the metal piston by radiations and stray fields by the PMK, which will result in repulsion of the PMK body.

An apparatus for forming the PMK according to the method described hereinabove is illustrated schematically in FIG. 8. As shown, a structural shell 48 of generally oval cross section has the two electrodes 12 and 14, described above, mounted within its enclosed volume. A transparent partition 50, which may be constructed of quartz for example, may be used to separate the structural shell 48 into a PMK triggering or ignition chamber 52 and an ionization energy chamber 54. A high intensity helical flashlamp filiment 56, which is coupled to a suitable power source 58, is shown mounted in the ionization energy chamber 54. It will be appreciated by those skilled in the art that the high intensity flashlamp 58 is merely representative of one of the various types of ionization energy sources can be substituted for it. Similarly, the transparent partition 50, if one is used, is understood to be transparent to the type of energy generated by the energy source selected for use in the ionization energy chamber 54. A suitable reflecting surface 60 is formed or coated on an inner surface of the ionization energy chamber 54 to provide a means of focusing the energy created by the high intensity flashlamp filament 56 (or any suitable energy source) at a focal point or region 62 in the ignition chamber 52. Alternatively, the partition 50 may be designed as a lens to focus the ionization energy. The intense light radiation generated by ignition of the flashlamp filament produces the desired helical ionized path in the atmosphere 10 of the ionization chamber 52. Thus by closing the switch 22 at precisely the moment when the helical ionized path 20 is fully formed by the focal point or region 62, a helical current stroke 24 of the type illustrated in FIG. 2 is produced, resulting in the formation of a PMK as described above.

The starting pressure of the atmosphere 10 within the structural shell 48 is preferably in the range from 0.5 to 5.0 atmospheres.

The PMK plasma configuration can be formed with widely varying initial energies and in a wide range of sizes. In general, however, as greater energy is used to initiate the PMK, its physical diameter increases, as does its lifetime due to a corresponding increase in the inductance of the PMK. One key factor which must generally be observed in forming the PMK, however, is a current rise time of approximately $10^9$ to $10^{13}$ amp/sec. in order to create the evacuated region 26. Given this current rise time the voltage or energy input required to produce the PMK will be determined primarily by well known physical characteristics such as the pressure of the atmosphere 10, the resistance of the atmosphere, the inductance of the discharge channel, and the distance between the electrodes 12 and 14. Thus a small PMK having a diameter on the order of ten centimeters may be formed in a small triggering chamber of from 20 to 100 cm in diameter with a total energy input of tens of kilojoules. Such a small, low energy PMK would have lifetime on the order of 1 second, depending upon the precise atmospheric conditions, including the pressure and type of gas used. A more practical PMK suitable for nuclear fusion research requires approximately 1 megajoule in its poloidal field, and has a diameter of approximately 3 to 4 meters. The lifetime of such a PMK would be on the order of 10 seconds, and a triggering chamber on the order of 5 meters in diameter would be required. Finally, a large PMK for high power output fusion reactions would possess a field energy on the order of $10^{10}$ joules. The lifetime for such a large PMK would be on the order of hundreds of seconds, and a triggering chamber on the order of 15 to 20 meters in diameter would required.

The initial energy for generating the PMK is obtained from conventional high voltage sources, such as capacitor banks of the type now used in lightning simulating machines and various types of nuclear research devices. The exact temperature of the kernel current naturally depends upon the energy of the PMK, the atmospheric pressure and many other factors. The mantle temperature similarly varies depending upon the precise conditions under which the PMK is formed. However, the mantle temperature is significantly below the kernel temperature. The kernel temperature for a large compressed PMK will surpass the temperature required for nuclear fusion.

Figure 8:
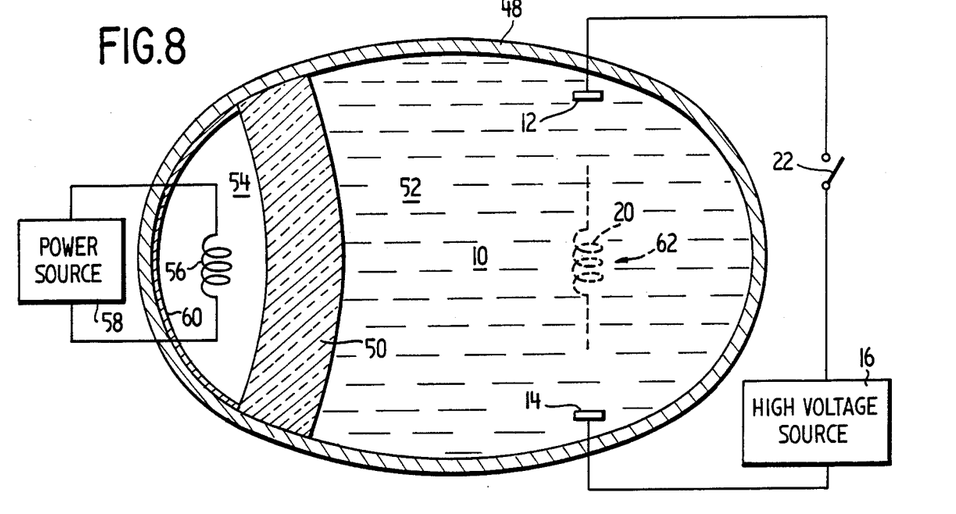
FIG. 8 is a schematic representation of a first embodiment of an apparatus for performing the method of the present invention.
Figure 9:
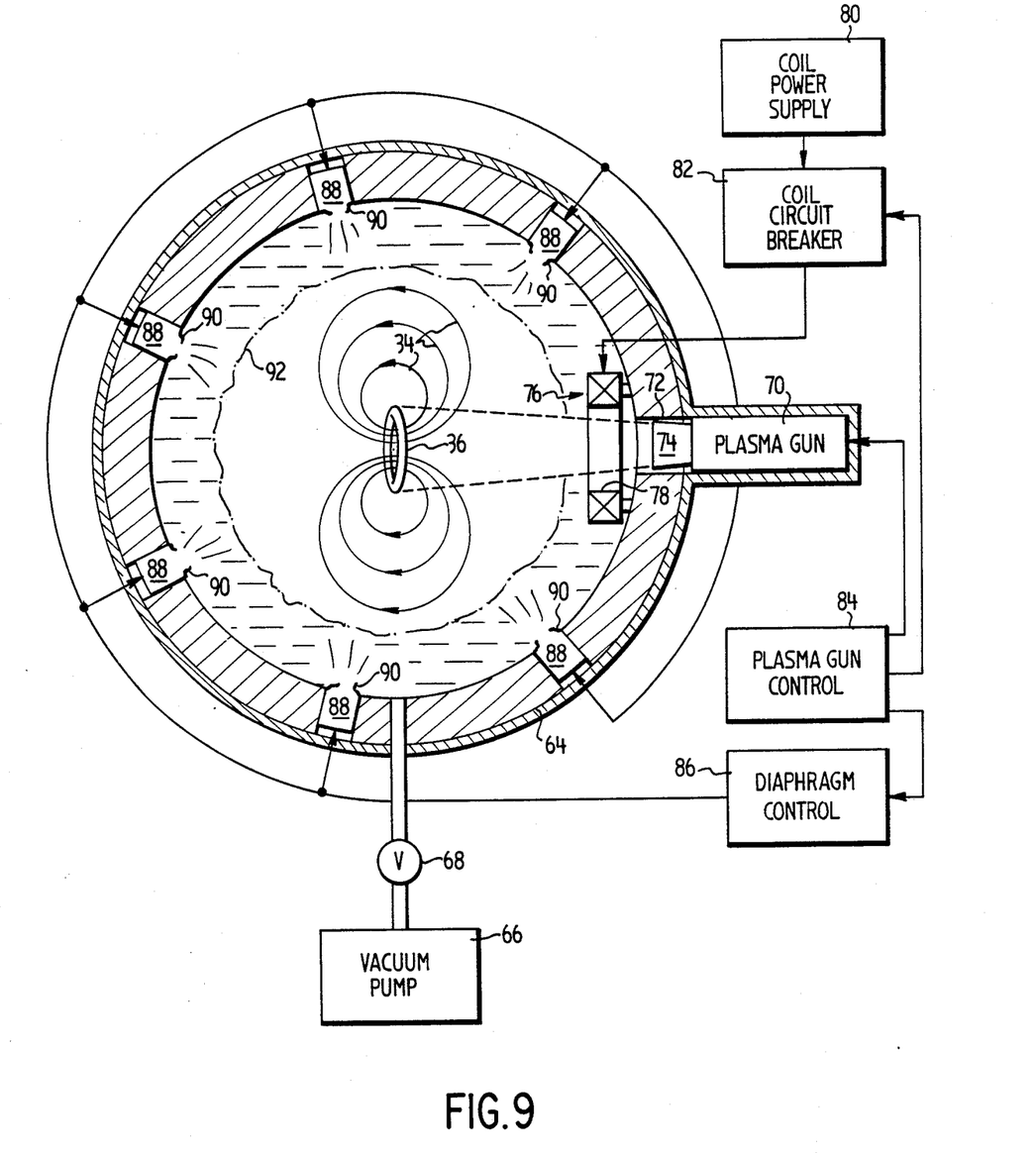
FIG. 9 is a schematic illustration of a second embodiment of an apparatus for performing the method of the present invention.

A second method and apparatus for producing the PMK configuration is illustrated in FIG. 9. In the FIG. 9 embodiment a pressure vessel 64 is shown which may be equivalent to the triggering chamber 52 of FIG. 8. The configuration, structural material and pressure withstanding capability of the pressure vessel 64 are dictated by the size and energy of the PMK to be produced, as will be apparent to those skilled in the art. A vacuum pump 66 is coupled through a suitable pressure valve 68 to the interior of pressure vessel 64 for the purpose of evacuating it. A conventional plasma or plasmoid generating gun 70 is mounted in a suitable aperture 72 in the wall of the pressure vessel 64. As is well known to those skilled in the art, the plasma gun 70 is capable of generating and projecting plasmoids of any suitable configuration into the interior of pressure vessel 64. In the apparatus of the present invention, the plasma generating gun 70 is preferably selected to generate toroidal plasmoids, as illustrated schematically at 74. A high energy coil or air core inductor 76 of generally cylindrical configuration is mounted to the walls of the pressure vessel 64, and is oriented such that its central aperture 78 is aligned with the plasma gun 70, so that the toroidal plasmoids 74 generated by the plasma gun 70 will pass through the central aperture of the coil 76. A high energy power supply 80 is coupled through a suitable circuit breaker 82 to the high energy coil 76 for energizing the coil. The coil power supply 80 is preferably a conventional high power supply of the type used for producing intense magnetic fields in known nuclear fusion research machines. A plasma gun control 84 is coupled to the plasma gun 70 for initiating the generation of a plasmoid and its expulsion into the pressure vessel 64. The plasma gun control is also coupled to the coil circuit breaker 82 and to a diaphragm control 86 for actuating both of these devices. The diaphragm control 86 is in turn coupled to a plurality of gas pressure sources 88 located symmetrically around the inner surface of the pressure vessel 64. Each of the gas pressure sources is initially sealed by a frangible diaphragm 90. The gas pressure sources 88 may be cylinders or containers of compressed gas sealed by a diaphragm which is explosively destroyed in response to receipt of an electrical ignition signal from the diaphragm control 86. Alternatively, the gas pressure sources may simply include quantities of a suitable gas packaged in an explosive housing which is ignited by a signal from the diaphragm control 86. Naturally, numerous equivalent types of conventional fluid pressure sources can be used in lieu of the specific structures described.

In operation, the pressure vessel 64 is initially evacuated by the vacuum pump 66. The high energy coil 76 is then energized by the coil power supply 80 so that an intensive magnetic field is built up in the vicinity of the coil 76, and in particular in the region of the central aperture 78. The plasma gun control 84 is then triggered to cause a toroidal plasmoid 74 to be generated and projected through the central aperture 78 of the high energy coil 76. Alternatively, the high energy coil can be mounted inside the pressure vessel 64 opposite the plasma gun 70. The toroidal plasmoid would then projected toward the central aperture of the coil so as to be reflected therefrom with an absorption of energy. The plasma gun control 84 is coupled to the coil circuit breaker 82 to provide a timed circuit breaker signal so that the coil circuit breaker is opened at precisely the instant during which the toroidal plasmoid 74 passes through the central aperture 78. It will be course, be appreciated that the high energy coil 76 is actually an air core inductor, and then the central aperture 78 is the air core of the inductor. As the plasmoid 74 passes through the air core at the same instant that the coil power supply circuit is broken, a large transfer of magnetic energy from the collapsing field of the coil 76 to the plasmoid will take place. Thus the plasmoid 74 will imerge from the coil 76 with a greatly increased energy. As the plasmoid travels toward the center of the pressure vessel 64, a second appropriately timed signal from the plasma gun control 84 actuates the diaphragm control 86, causing the individual diaphragms 90 to be explosively fractured so that a resulting shock wave front 92 is produced by high pressure gas escaping from the gas pressure sources 83. This shock wave front 92 surrounds and is ionized by the radiations of the now highly energized toroidal plasmoid 74, which has become a toroidal current loop kernel 36 of the type previously described. The ionized wave front 92 then becomes equivalent to the previously described mantle 28. As a result a PMK is formed within the pressure vessel 64.

Various modifications of the apparatus illustrated in FIG. 9 are possible. For example, the coil 76 may be removed from the interior of the pressure vessel 64 once the PMK is formed, to prevent damage due to the intense heat within the vessel. Furthermore, the apparatus illustrated in FIG. 8 may be combined with that illustrated in FIG. 9 to the extent that the plasma gun 70 of FIG. 9 may be replaced by a high intensity flashlamp 56, or equivalent energy source, of the type described with reference to FIG. 8. Thus the PMK could be formed in the vessel of FIG. 9 according to the method described with reference to FIG. 8. The gas pressure apparatus of FIG. 9 would then be used for the purpose of compressing the PMK after it has already been formed to increase the energy concentration in the plasma kernel 36.

Having described the general characteristics of the PMK and methods of generating it in the previous material, emphasis will now be directed to techniques which utilize the unique properties of the PMK to produce nuclear fusion. In particular, one of the most unique properties of the PMK is its capability of being compressed by a mechanical force such as fluid pressure. This characteristic permits the energy of the PMK to be increased dramatically simply by the use of conventional and inexpensive mechanical or chemical energy sources, such as conventional hydraulic techniques and the like.

Figure 10:
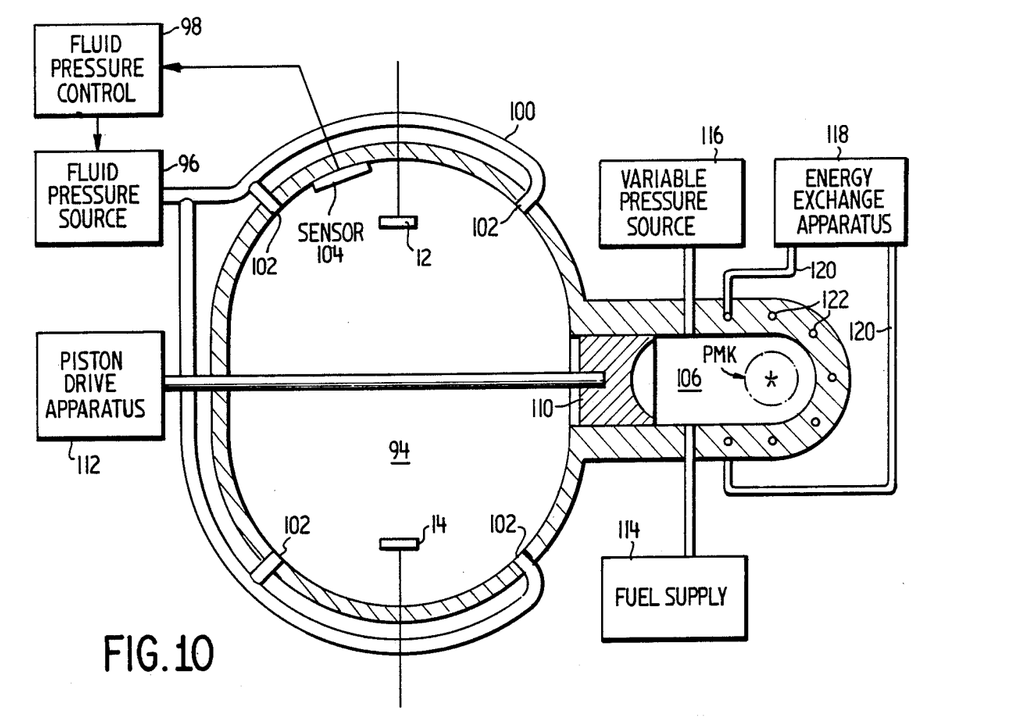
FIG. 10 is a schematic illustration of a third embodiment of an apparatus for performing the method of the present invention.

Referring now to FIG. 10, an apparatus is illustrated in schematic form for producing fusion energy using a PMK. The apparatus includes a triggering chamber 94, which can be equivalent to the triggering chamber 52 of FIG. 8 or the pressure vessel 64 of FIG. 9. A pair of electrodes 12 and 14 are illustrated in FIG. 10, and are equivalent to those illustrated in the apparatus of FIG. 8 for forming a PMK to the discharge method heretofore described. When this method of forming the PMK is used, an apparatus for providing ionization energy of the type illustrated in FIG. 8 must be provided. Although such an apparatus is not illustrated in FIG. 10, it will be understood that this apparatus could easily be coupled to the triggering chamber 94 of FIG. 10. Alternatively, the electrodes 12 and 14 could be eliminated, and a plasma gun system of the type illustrated in FIG. 9 could be used to generate the PMK. In this case, the control equipment and shock wave generating system illustrated in FIG. 9 would have to be added to the triggering chamber 94 of FIG. 10. Thus a PMK can be initiated by any technique in the triggering chamber 94 of the apparatus of FIG. 10. Once the PMK is initiated, a fluid pressure system including a fluid pressure source 96 which is regulated by a fluid pressure control 98, is used to compress the PMK. More particularly, the fluid pressure source includes a supply of a suitable gas or liquid which is coupled through a pressure line 100 to a suitable plurality of pressure inputs 102 located around the periphery of the ignition chamber 94. It will be understood, of course, that a plurality of remote control valves (not shown) may be used to open or close the pressure inputs 102, if desired. A pressure sensor 104 is preferably located in a portion of the wall of the triggering chamber 94 to provide a feedback indication to the fluid pressure control source 98 as to the actual pressure existing within the triggering chamber 94. In operation, the PMK is first ignited and the fluid pressure within the ignition chamber 94 is subsequently increased to compress the PMK to a suitable diameter. At this time a mechanical apparatus or an electrical or magnetic field is used to physically transport the PMK into a furnace chamber 106 which is enclosed within a furnace housing 108 mounted to the triggering chamber 94. In FIG. 10 the means for moving the PMK is illustrated as a piston 110 powered by a piston drive apparatus 112. The piston drive apparatus may be a conventional hydraulic unit, an explosive chamber, a combination of hydraulic and explosive devices, or any other suitable power source. An additional pressure sensor (not shown) can also be provided in the furnace chamber 106 to permit a pressure control system to be coupled to the furnace chamber.

The piston 110 is used to move the PMK into the furnace 106, and can also be used to further compress the PMK once it is within the furnace chamber. Alternatively, additional fluid pressure in the form of a gas or liquid of fussionable nuclei can be supplied from a fuel supply source 114. A variable pressure source 116 can also be used to further increase the pressure in the furnace chamber in conjunction with the action of the piston 106. An energy exchange apparatus 118 is coupled to the walls of the furnace chamber 106 by means of a conduit 120 which can be used to circulate a cooling fluid, such as liquid lithium, or any other suitable reactor cooling fluid through a network of cooling passages in the walls of the furnace chamber 106. Naturally, the art of energy transfer is highly developed, and any suitable prior art energy transfer apparatus or system can be used in lieu of the device schematically illustrated in FIG. 10.

The dimensions and construction of the apparatus illustrated in FIG. 10 are dictated by the size and power output of the PMK desired. Accordingly, the apparatus illustrated in the FIG. 10 vary widely in size. However, the figures set forth earlier with regard to the structure illustrated in FIG. 8 apply to the structure of FIG. 10, and also to the structure of FIG. 9.

In the apparatus of FIG. 10 pressures of 1,000 atmospheres and more can be obtained using conventional state of the art techniques. With such increases in pressure, the energy concentration of the PMK will increase dramatically, thereby substantially increasing the temperature and density of the PMK, as well as its lifetime. If the initial size of the PMK is sufficiently large, the increase in pressure and decrease in volume can easily result in an increase in the kernel plasma energy to produce temperature above nuclear fusion temperatures, whereby fusion will occur within the furnace chamber 106. Once fusion occurs, the fusion energy released will supply additional energy to the PMK, extending its life for a substantial interval, on the order of several minutes, and perhaps hours in the ideal case. For supplying a continuous output of fusion power, it is contemplated that a battery of devices of the type illustrated in FIG. 10 may be constructed and energized sequentially. Thus each device will provide energy output as its PMK burns, and as the PMK burns out, subsequent ignition and furnace apparatuses are energized to continue generating the output power.

Numerous modifications and variations of the present invention are possible. For example, in the embodiment of FIG. 9 the plasma gun can be removed, and a toroidal plasmoid can be generated simply by the use of a high energy coil in the pressure of a preionized atmosphere of the type illustrated in FIG. 9. With this modification, however, it is necessary to provide an external field for moving the toroidal plasmoid from the air core of the coil 76 to an appropriate position near the center of the pressure vessel 64, so that the toroid will be symmetrically disposed within the shock wave 92, when it is generated.

It is also important to note that in the embodiment of FIG. 8, and in the previously described discharge method of generating the PMK, that the discharge between the electrodes 12 and 14 should occur at precisely the instant of maximum ionization of helical path 30. Thus suitable timing and control equipment is preferably coupled between the ionization power source 58 and the high voltage switch 22 so that the high voltage switch 22 is closed at an appropriate instant after the ionization energy source is triggered.

Furthermore, although the present invention is described with primary emphasis on its utility as a technique for studying a unique plasma configuration and for generating nuclear fusion energy, the present invention also has many additional uses. For example, the high energy PMK can be used as an extremely intense light source for the purpose of pumping lasers, or for any other purpose. Similarly, the PMK can be used as an intense electromagnetic heat source. In addition, the PMK can be used as a device for storing and transferring large quantities of electromagnetic energy which exist for brief intervals. In addition, the PMK can be used as a device for simulating other types of high energy electromagnetic phenomena. Many additional uses of the PMK and the described methods and apparatus for generating it will be readily apparent to those skilled in the art.

It is noted that sustained fusion reactions can be maintained according to the method and apparatus of the present invention by proper selection of fuel materials. Selection of the proper materials permits a small quantity of raw fuel nuclei to continuously diffuse into the high temperature plasma to maintain the fusion reaction.

In the embodiment of FIG. 9, the plasma gun 70 can be removed, and the aperture 72 sealed with a transparent partition of the type illustrated at 50 in FIG. 8. Thus an ionization energy source can be positioned outside the pressure vessel 64 to convert the apparatus of FIG. 9 to the same mode of operation as the apparatus of FIG. 8.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for producing a compound plasma configuration comprising:
   vessel means for containing said compound plasma configuration, said vessel adapted to contain a fluid medium including fusionable nuclei, said vessel including means for permitting ionizing energy to pass into said fluid medium,
   a pair of spaced electrodes positioned within said vessel,
   a high voltage power source coupled to said electrodes for producing a discharge current through said fluid medium,
   control means coupled to said high voltage power source for controlling the initiation of said discharge current
   means cooperating with said vessel for causing said discharge current to follow a controlled path through said fluid medium,
   compression chamber means coupled to and communicating with said vessel for withstanding internal pressures,
   means cooperating with said compression chamber means for non-magnetically compressing any fluid in said compression chamber means,
   means cooperating with said vessel and said compression chamber means for moving a compound plasma generated in said vessel into said compression chamber means; and,
   energy exchange means coupled to said compression chamber means for removing energy therefrom.

2. An apparatus for producing a compound plasma configuration comprising:
   vessel means for containing said compound plasma configuration, said vessel including aperture means for projecting energy into said vessel,
   air core inductor means coupled to said vessel so that said core thereof is aligned with said aperture means,
   plasma gun means for generating a toroidal plasmoid and projecting said plasmoid into said vessel, said plasma gun means aligned with said air core and said aperture means so that said plasmoid passes through both upon leaving said plasma gun means,
   power supply means coupled to said air core inductor means for energizing said coil whereby a magnetic field is produced in the region of said air core,
   vacuum pump means coupled to said vessel for evacuating the interior thereof prior to actuation of said plasma gun means,
   gas pressure source means coupled to said vessel for releasing a pressure wave within said vessel after actuation of said plasma gun means,
   control means coupled to said power supply means, said plasma gun means and to said gas pressure source means for sequentially controlling said plasma gun means, said power supply means and said gas pressure source means.

3. An apparatus as in claim 2, further comprising:
   compression chamber means coupled to and communicating with said vessel for withstanding internal pressures,
   means cooperating with said compression chamber means for non-magnetically compressing any fluid in said compression chamber means; and,
   means cooperating with said vessel and said compression chamber means for moving a compound plasma generated in said vessel into said compression chamber means.

4. A method for producing a compound plasma configuration comprising the steps of:
   providing a vessel for containing said compound plasma configuration,
   evacuating said vessel,
   energizing an air core inductor associated with said vessel,
   generating a toroidal plasmoid,
   projecting said toroidal plasmoid into said vessel through said air core of said air core inductor,
   deenergizing said air core inductor as said toroidal plasmoid passes through said air core,
   energizing said toroidal plasmoid by energy transfer from the collapsing magnetic field of said deenergized air core inductor; and,
   generating a pressure wave front surrounding said energized toroidal plasmoid.

5. A method of producing a compound plasma configuration comprising the steps of:
   providing a containing means for containing said compound plasma configuration,
   providing a gaseous atmosphere including fusionable nuclei within said containing means,
   providing a power source capable of producing a current discharge through said atmosphere,
   reducing electrical resistance along a path of predetermined geometrical configuration within said atmosphere to induce said current discharge to follow said geometrical configuration,
   discharging said power source through said atmosphere after said step of reducing,
   creating a low pressure region in said atmosphere by said step of discharging,
   forming an ionized boundary layer along the boundaries of said low pressure region by said step of discharging,
   utilizing as said geometrical configuration a configuration which generates a first magnetic field of predetermined configuration,
   utilizing said first magnetic field to force at least a portion of said current discharge to form a hot, closed plasmoid within said low pressure region,
   forming a second magnetic field of a generally poloidal configuration by the action of said portion of said discharge current circulating within said plasmoid, closing said ionized boundary around said closed plasmoid to form a mantle of ionized particles generally conforming to a spherical shape due to said configuration of said second magnetic field.

6. A method as in claim 5, wherein said step of reducing includes the step of:

focusing ionizing energy on a portion of said atmosphere.

7. A method as in claim 6, further comprising the step of:

selecting said ionizing energy from the group consisting of x-ray, electron beam and optical energy.

8. A method as in claim 5, wherein said step of reducing includes the step of:

utilizing a gas vortex having a heliform rarefaction channel.

* * * * *

UNITED STATES PATENT AND TRADEMARK OFFICE
CERTIFICATE OF CORRECTION

PATENT NO. : 4,891,180

DATED : January 2, 1990

INVENTOR(S) : Paul M. Koloc

It is certified that error appears in the above-identified patent and that said Letters Patent is hereby corrected as shown below:

On the title page:
In the ABSTRACT, item [57], please change all occurrences of "mantel" to -- mantle --.

Columns 1 through 14, please change all occurrences of "mantel" to -- mantle --.

Column 1, line 46, change "looses" to -- losses --;
         line 55, change "Tokomak" to -- Tokamak --.

Column 3, line 33, after "helical path so that" and before "generally" insert -- a --.

Column 5, line 8, change "surround" to -- surrounding --;

line 62, change "in" to -- to --.

UNITED STATES PATENT AND TRADEMARK OFFICE
CERTIFICATE OF CORRECTION

PATENT NO. : 4,891,180

DATED : January 2, 1990

INVENTOR(S) : Paul M. Koloc

It is certified that error appears in the above-identified patent and that said Letters Patent is hereby corrected as shown below:

Column 6, line 15, after "sources" and before "can" insert -- that --.

Column 8, line 8, after "would then" and before "projected" insert -- be --;
line 15, change "be course," to -- of course, --;
line 23, change "imerge" to -- emerge --.

Column 9, line 55, change "fussionable" to -- fusionable --.

Signed and Sealed this

Twenty-first Day of April, 1992

Attest:

HARRY F. MANBECK, JR.

*Attesting Officer*  *Commissioner of Patents and Trademarks*